(12) United States Patent
Damodaran et al.

(10) Patent No.: US 8,904,110 B2
(45) Date of Patent: Dec. 2, 2014

(54) DISTRIBUTED USER CONTROLLED MULTILEVEL BLOCK AND GLOBAL CACHE COHERENCE WITH ACCURATE COMPLETION STATUS

(75) Inventors: Raguram Damodaran, Plano, TX (US); Abhijeet A. Chachad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 588 days.

(21) Appl. No.: 13/240,479

(22) Filed: Sep. 22, 2011

(65) Prior Publication Data

US 2012/0191913 A1 Jul. 26, 2012

Related U.S. Application Data

(60) Provisional application No. 61/387,283, filed on Sep. 28, 2010.

(51) Int. Cl.
*G06F 13/00* (2006.01)
*G06F 13/28* (2006.01)
*G06F 12/02* (2006.01)
*H03K 19/00* (2006.01)
*G06F 9/30* (2006.01)
*H03K 21/00* (2006.01)
*G06F 7/483* (2006.01)
*G06F 1/32* (2006.01)

(52) U.S. Cl.
CPC .......... *G06F 9/3012* (2013.01); *G06F 12/0246* (2013.01); *H03K 19/0016* (2013.01); *H03K 21/00* (2013.01); *Y02B 60/32* (2013.01); *G06F 7/483* (2013.01); *G06F 1/3296* (2013.01)
USPC ................... 711/122; 711/143; 711/E12.043

(58) Field of Classification Search
USPC ................... 711/122, 143, E12.043
See application file for complete search history.

(56) References Cited

U.S. PATENT DOCUMENTS

| | | | |
|---|---|---|---|
| 6,681,293 B1 * | 1/2004 | Solomon et al. .............. | 711/122 |
| 6,704,843 B1 * | 3/2004 | Arimilli et al. ............... | 711/146 |
| 2006/0259701 A1 * | 11/2006 | Sohm et al. ................... | 711/122 |
| 2007/0180196 A1 * | 8/2007 | Guthrie et al. ............... | 711/141 |
| 2008/0104324 A1 * | 5/2008 | Raghuvanshi ................ | 711/122 |
| 2008/0133868 A1 * | 6/2008 | Glew ............................ | 711/171 |
| 2010/0064107 A1 * | 3/2010 | Eddy et al. ................... | 711/146 |
| 2010/0088472 A1 * | 4/2010 | Ukai ............................ | 711/130 |

* cited by examiner

*Primary Examiner* — Edward Dudek, Jr.
(74) *Attorney, Agent, or Firm* — Robert D. Marshall, Jr.; Frederick J. Telecky, Jr.

(57) ABSTRACT

This invention permits user controlled cache coherence operations with the flexibility to do these operations on all levels of cache together or each level independently. In the case of an all level operation, the user does not have to monitor and sequence each phase of the operation. This invention also provides a way for users to track completion of these operations. This is critical for multi-core/multi-processor devices. Multiple cores may be accessing the end point and the user/application needs to be able to identify when the operation from one core is complete, before permitting other cores access that data or code.

13 Claims, 12 Drawing Sheets

US 8,904,110 B2

DISTRIBUTED USER CONTROLLED MULTILEVEL BLOCK AND GLOBAL CACHE COHERENCE WITH ACCURATE COMPLETION STATUS

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is caches in digital data processors.

BACKGROUND OF THE INVENTION

In a data processing apparatus having a multi-level cache system, it is critical that all the levels of cache be kept coherent to the next level of cache and to external memory. This is typically handled by giving the user the capability to initiate operations to the caches coherent.

SUMMARY OF THE INVENTION

This invention permits user controlled cache coherence operations with the flexibility to do these operations on all levels of cache together or at least one level independently. In the case of an all level operation, the user does not have to monitor and sequence each phase of the operation.

This invention also provides a way for users to track completion of these operations. This is critical for multi-core/multi-processor devices. Multiple cores may be accessing the end point and the user/application needs to be able to identify when the operation from one core is complete, before permitting other cores access that data or code.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
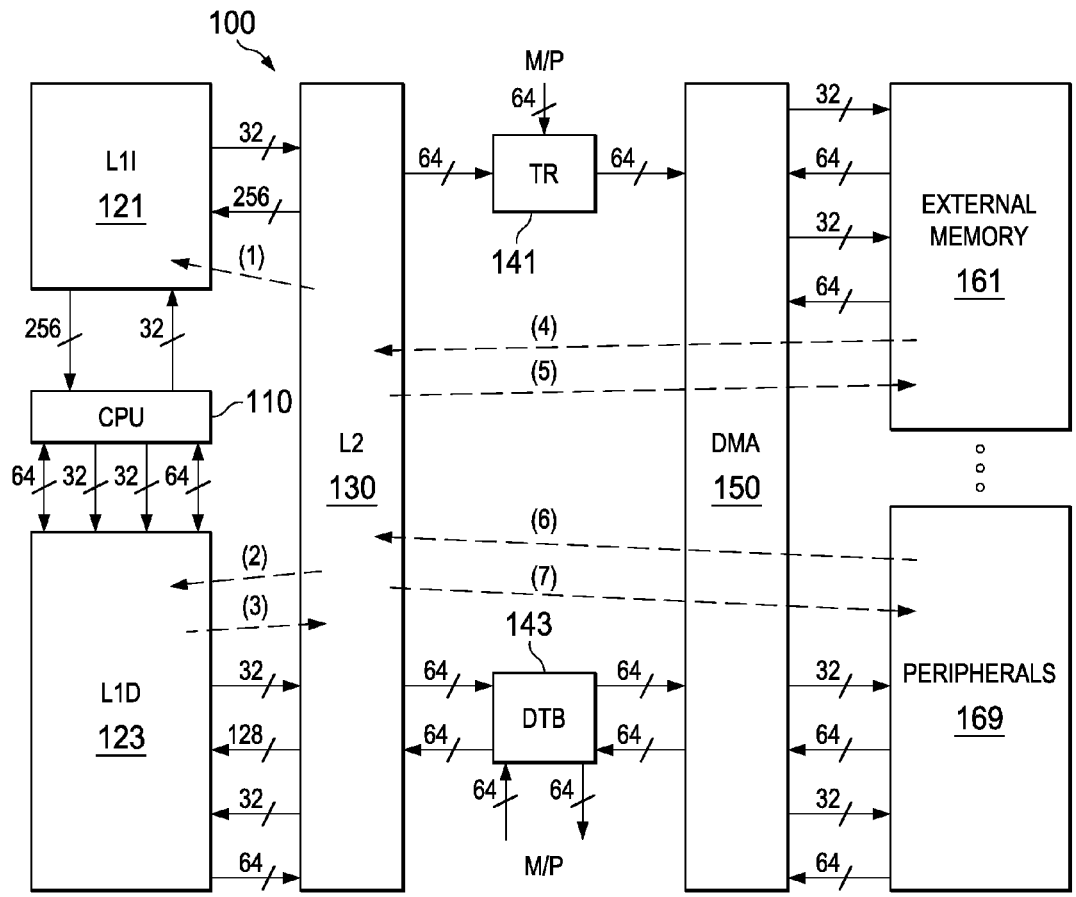
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
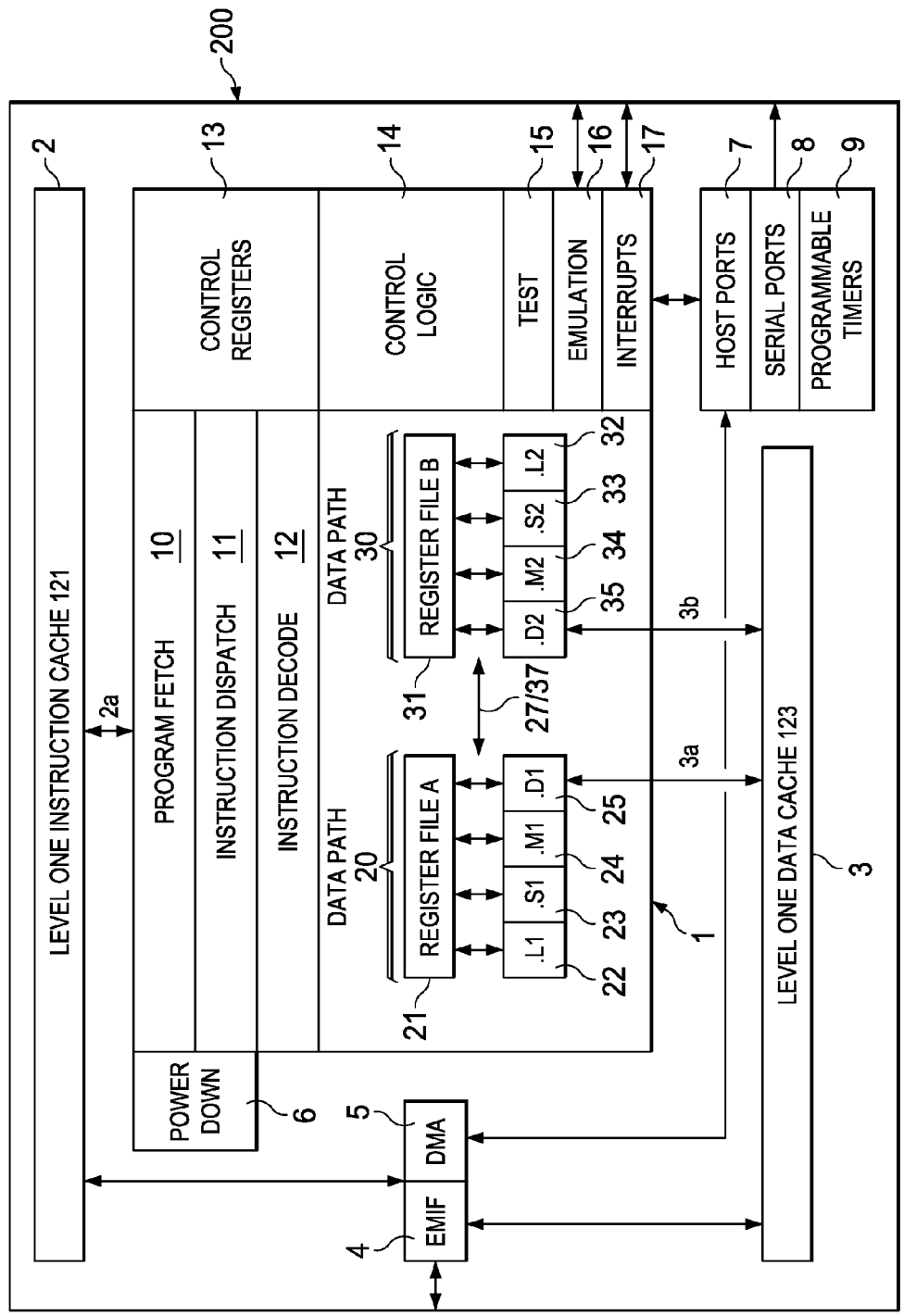
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
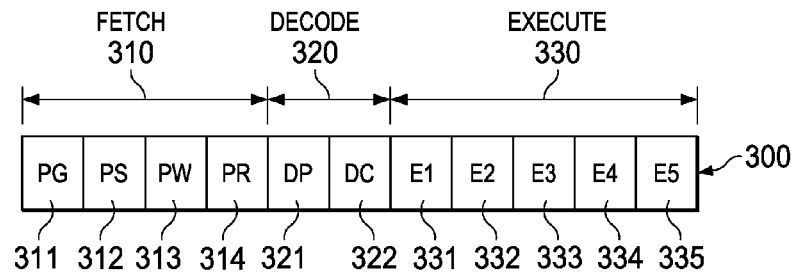
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figure 4:
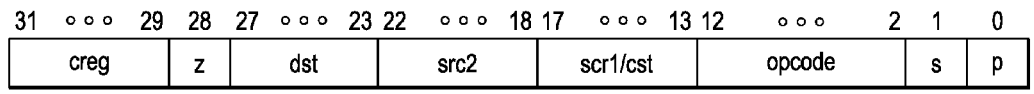
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional   | creg | | | z |
|---------------|------|------|------|---|
| Register      | 31   | 30   | 29   | 28 |
| Unconditional | 0    | 0    | 0    | 0 |
| Reserved      | 0    | 0    | 0    | 1 |
| B0            | 0    | 0    | 1    | z |
| B1            | 0    | 1    | 0    | z |
| B2            | 0    | 1    | 1    | z |
| A1            | 1    | 0    | 0    | z |
| A2            | 1    | 0    | 1    | z |
| A0            | 1    | 1    | 0    | z |
| Reserved      | 1    | 1    | 1    | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Digital data processors such as digital signal processor system 100 employ cache memory based upon two factors. Digital data processors access memory for instructions and data during their operations. The digital data processor would operate at maximum operational speed with large, fast memory. Large memories have slow access times relative the operation speed of the digital data processor. Small memories can have faster access times but are limited in size. Digital data processors use both small, fast memory (cache memory) for speed and large, slow memory for size. The cache memory directly supplies the central processing unit with instructions or data supplied from the large, slow memory. This technique is helpful because of two locality principles. If a data word is accessed, it is likely to be accessed again in the near future (temporal locality). The first storage of newly accessed data in a cache is no faster than recalling it directly from the large, slow memory. However once cached, further accesses to this data can be serviced from the faster cache memory. If a data word is accessed, it is likely that nearby data words will be accessed again in the near future (spatial locality). Thus plural nearby data words are loaded into the cache together. Later accesses to the nearby data words can be serviced from the faster cache memory.

Figure 5:
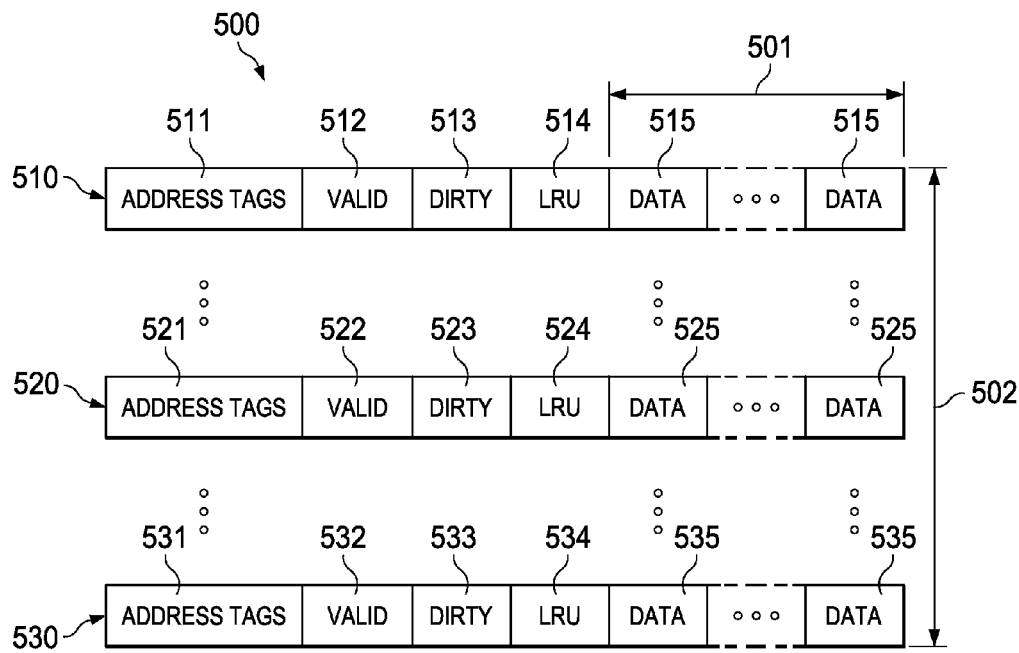
FIG. 5 illustrates the details of a set of typical prior art cache lines (prior art)

FIG. 5 illustrates the details of plural cache lines such as used in L1I cache 121, L1D cache 123 and L2 cache 131 illustrated in FIG. 1. Cache 500 illustrated in FIG. 5 includes cache lines 510, 520 and 520 are representative of the internal structure of cache 500. Each of cache lines 510, 520 and 530 includes: respective address tags 511, 521 and 522; respective valid bits 512, 522 and 523; respective dirty bits 513, 523 and 533; respective least recently used (LRU) indicators 514, 524 and 534; and respective data words 515, 525 and 535. Each cache line 510, 520 and 530 includes plural respective data words 515, 525 and 535. The bit length of data words 515, 525 and 535 is set by the minimal addressable data amount of CPU 110. This is typically 8 bits/1 byte.

Cache 500 stores data from more distant memories such as external memory 131 which are accessed by a multi-bit address. Cache 500 is organized to facilitate this storage and to facilitate finding such data in the cache. Each cache line 510, 520 and 530 typically stores $2^N$ respective data words 515, 525 and 535, when N is an integer. The position of data words 515, 525 and 535 within the corresponding cache line 510, 520 and 530 along the dimension 501 serves as a proxy for the least significant bits of the address.

The position of cached data within lines along dimension 502 serves as a proxy for the next most significant bits of the address. The corresponding address tags 511, 521 and 531 form the remainder of the data word address. To determine if a memory access is to data cached within cache 500 (a cache hit), cache 500 compares the address tags for all cache lines to the most significant bits of the memory location accessed. Upon a detecting a match, the position within the cache line along dimension 501 corresponds to the least significant bits of the address permitting identification of the data word accessed.

Each data word 510, 520 and 530 includes a corresponding valid bit 512, 522 and 532. A first state of this valid bit indicates the corresponding data words 515, 525 or 535 are valid. An opposite state of this valid bit indicates the corresponding data words 515, 525 or 535 are not valid. There are several instances where data stored within cache 500 would not be valid. Upon initial activation of digital signal processor system 100 the L1I cache 121, L1D 123 cache and L2 cache 131 would not be loaded. Thus they would not store valid data. Accordingly, all cache lines are initially marked invalid. During a cache access a match of a requested address with address tags 511, 521 or 531 would not detect a match unless the corresponding valid bit 512, 522 or 532 indicated the data was valid.

Each data word 510, 520 and 530 includes a corresponding dirty bit 513, 523 and 533. A first state of this valid bit indicates the corresponding data words 515, 525 or 535 are dirty. An opposite state of this valid bit indicates the corresponding data words 515, 525 or 535 are not dirty (clean). Cache memory is generally used for both read accessed and write accesses. Upon a cache hit for a write access, the write data is written into the corresponding location within cache 500. According to the preferred writeback technique, this write data is not immediately forwarded to external memory 131. Instead the respective dirty bit 513, 523 or 533 is set to indicate dirty. A dirty indication means that there has been a write to the cached data not currently reflected in the base memory. According to the writeback technique this data is written to the base memory with the expectation that this writeback can accumulate plural writes to the memory location and nearby memory locations within the same cache line to reduce traffic on the bus to external memory 131.

The least recently used (LRU) bits 514, 524 and 534 are used when a cache line is replaced. Because the cache cannot hold all the data stored in the large, slow memory, the data within the cache must be replaced with new data regularly. Using a data words location within dimensions 501 and 502 as proxy for the least significant bits introduces a problem in locating data within cache 500. If there is only a single cache line having the same location on dimensions 501 and 502, then plural data from the large, slow memory will alias to the same cache line in cache 500. This is data having the same least significant address bits corresponding to dimensions 501 and 502 but differing most significant address bits. An access to such aliased data would require the previous data at that cache line to be replaced. This is considered disadvantageous. A typical prior art cache is set associative. Thus a set of cache lines have the same location on dimensions 501 and 502. Typical sets include two members (two-way set associative) or four members (four-way set associative). Each cache line of such a set is called a way. A cache miss to an address that aliases to one of these sets needs only to evict one of these ways. Determination of which way to evict is typically made based on prior usage of these ways. According to both the temporal and spatial locality principles more recently used cache ways are more likely to be reused than less recently used cache ways. LRU bits 514, 524 and 534 track accesses to cache ways within the set. When data is to be replaced the LRU bits indicate the least recently used way for replacement. Maintaining cache coherence requires writeback of a dirty way upon such replacement.

Figure 6:
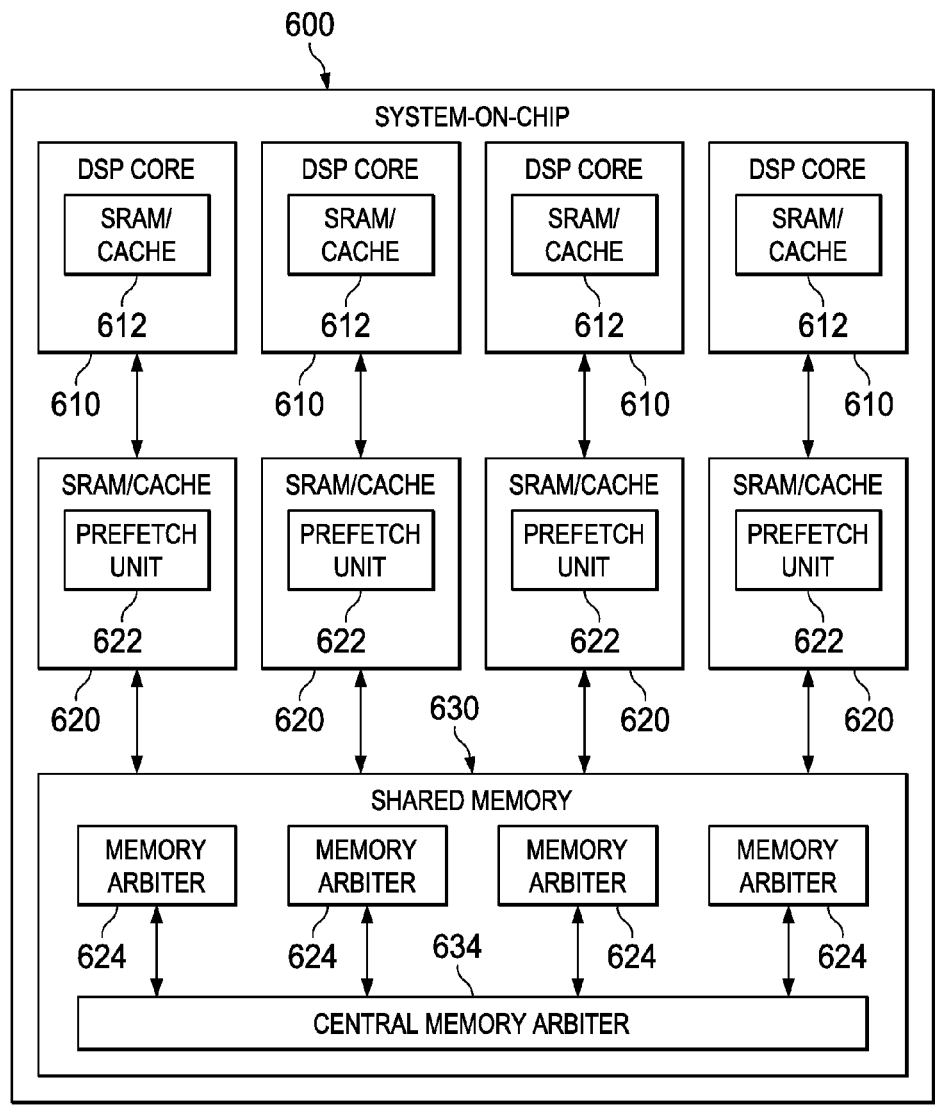
FIG. 6 illustrates a computing system including a local memory arbiter according to an embodiment of the invention.

FIG. 6 is a block diagram illustrating a computing system including a local memory arbiter according to an embodiment of the invention. FIG. 6 illustrates system on a chip (SoC) 600. SoC 600 includes one or more DSP cores 610, SRAM/Caches 620 and shared memory 630. SoC 600 is preferably formed on a common semiconductor substrate. These elements can also be implemented in separate substrates, circuit boards and packages. For example shared memory 630 could be implemented in a separate semiconductor substrate. FIG. 6 illustrates four DSP cores 610, but SoC 600 may include fewer or more DSP cores 610.

Each DSP core 610 preferably includes a level one data cache such as L1 SRAM/cache 612. In the preferred embodiment each L1 SRAM/cache 612 may be configured with selected amounts of memory directly accessible by the corresponding DSP core 610 (SRAM) and data cache. Each DSP core 610 has a corresponding level two combined cache L2 SRAM/cache 620. As with L1 SRAM/cache 612, each L2 SRAM/cache 620 is preferably configurable with selected amounts of directly accessible memory (SRAM) and data cache. Each L2 SRAM/cache 620 includes a prefetch unit 622. Each prefetch unit 622 prefetchs data for the corresponding L2 SRAM/cache 620 based upon anticipating the needs of the corresponding DSP core 610.

Each DSP core 610 is further coupled to shared memory 630. Shared memory 630 is usually slower and typically less expensive memory than L2 SRAM/cache 620 or L1 SRAM/cache 610. Shared memory 630 typically stores program and data information shared between the DSP cores 610.

In various embodiments, each DSP core 610 includes a corresponding local memory arbiter 624 for reordering memory commands in accordance with a set of reordering rules. Each local memory arbiter 624 arbitrates and schedules memory requests from differing streams at a local level before sending the memory requests to central memory arbiter 634. A local memory arbiter 624 may arbitrate between more than one DSP core 610. Central memory arbiter 634 controls memory accesses for shared memory 630 that are generated by differing DSP cores 610 that do not share a common local memory arbiter 624.

This invention is an improvement of U.S. Pat. No. 6,665,767 PROGRAMMER INITIATED CACHE BLOCK OPERATIONS. FIGS. 7 to 10 below correspond substantially to FIGS. 3 to 6 of that patent.

There are three types of programmer initiated cache block operations in the preferred embodiment of this invention. These are: Writeback Invalidate; Writeback; and Invalidate Only. A writeback operation transfers dirty data in the corresponding cache to the next level cache. As known in the art data stored in a cache is marked dirty in corresponding cache tags when the central processing unit alters the data in the cache. In such a case the proper state of the highest level memory is stored in the cache. This changed or dirty data must ultimately be written to the real memory location shadowed in the cache. The programmer initiated writeback and writeback and invalidate operations each write dirty data from the cache to a higher level memory. The first two operations make data coherent with the next level of cache. In the writeback operation, the corresponding cache tags are changed from dirty to clean upon the writeback. This change indicates the data in the corresponding real memory location corresponds to the data in the cache. This data remains available for cache use on a following read or write hit. In the writeback and invalidate operation, the corresponding cache tags are changed to indicate the data is invalid. Data so marked invalid is not available for cache use. An access to the corresponding address range will generate a cache miss and the consequent miss operations. A cache line with data marked invalid may be replaced on a cache allocation of new data. The invalidate operation does not writeback dirty data but merely marks it invalid and suitable for replacement. The invalidate operation is usually used for code or data that has not been modified or that is read only.

Figure 7:
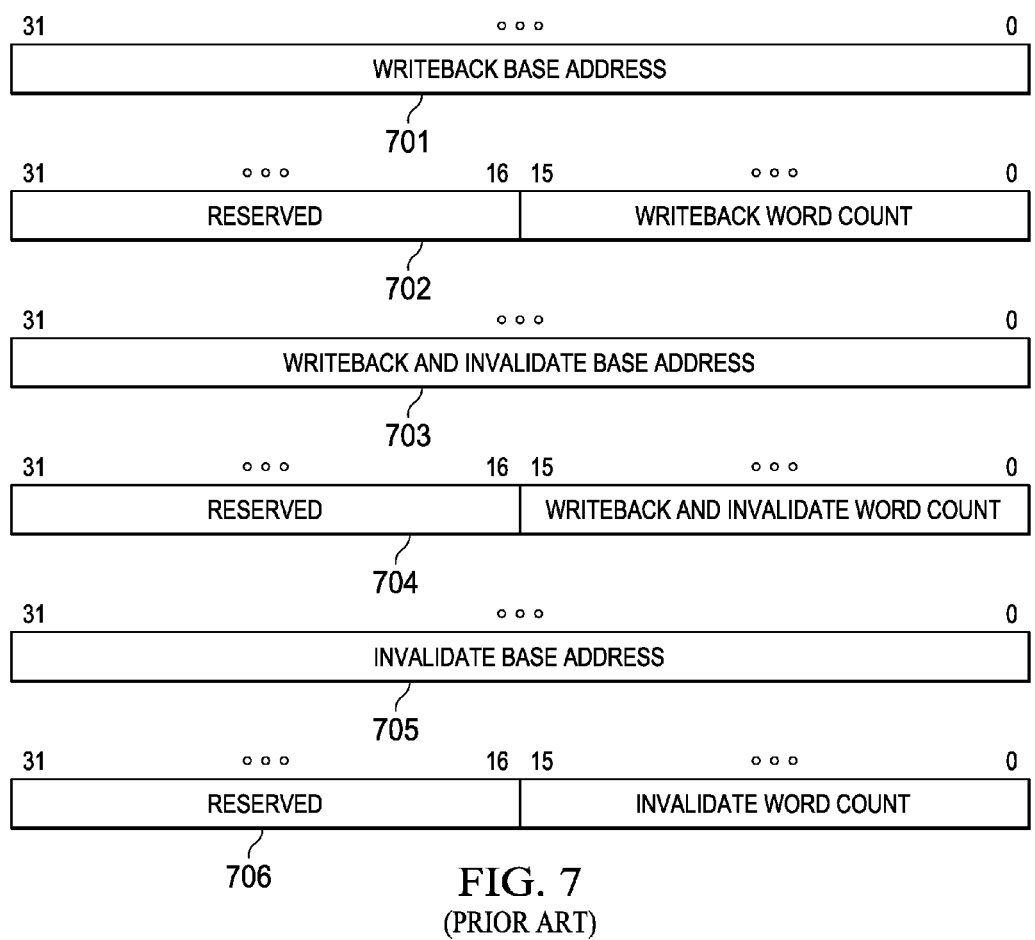
FIG. 7 illustrates the control registers employed in programmer control of caches of this invention.

FIG. 7 illustrates the memory mapping of the control registers employed in the present invention. One skilled in the art would realize that the control registers illustrated in FIG. 7 are a subset of the control registers 13 of digital signal processor core 200 illustrated in FIG. 2. The control registers illustrated in FIG. 7 are those control registers concerned with this invention. Control register 701 is called WBAR and named the writeback base address control register. In the preferred embodiment, this is a 32-bit register accessible at a predetermined memory mapped address. Control register 702 is called WBWC and named writeback word count control register. WBWC control register 702 is preferably 16 bits and accessible at a predetermined memory mapped address. Programmed initiated writeback from a cache includes writing data to the corresponding WBAR control register 701 and WBWC control register 702 in a manner that will be more fully explained below. Control register 703 is called WBIAR and named the writeback/invalidate base address control register. This is preferably a 32-bit register accessible at a predetermined memory mapped address. Control register 704 is called WBIWC and named writeback/invalidate word count control register and is preferably accessible at a predetermined memory mapped address. WBIWC control register 704 is preferably 16 bits. Programmed initiated writeback/invalidate from a cache includes writing data to WBIAR control register 703 and WBIWC control register 704. Control register 705 is called IAR and named the invalidate base address control register. This is preferably a 32-bit register accessible at a predetermined memory mapped address. Control register 706 is called IWC and named invalidate word count control register and is preferably accessible at a predetermined memory mapped address. IWC control register 706 is preferably 16 bits. Programmed initiated invalidation of the cache 121 includes writing data to IAR control register 705 and IWC control register 706.

For each function there are two programmer accessible control registers. One of these control registers stores an address and the other stores a word count. These registers are preferably accessible to the central processing unit 110 and not cached. In the preferred embodiment, these registers are in a special memory mapped control register set 13 illustrated in FIG. 2. To use the mechanism, the programmer first writes to the base address control register with the base address for the corresponding cache operation. A second write to the corresponding word count control register sets the length of the operation. The word size of the word count is a function of central processing unit 110. The base address control register and word count control register feed a small state machine. This state machine interacts with the cache tag and writeback mechanisms used during normal operations to provide the appropriate cache control cycles.

Once the address and word count registers have been updated, the cache control cycles can begin. The start of the cache operations can be signaled via a control register write to a bit, executing an instruction word or another convenient mechanism. In the preferred embodiment a write to one of the word count control registers initiates the corresponding cache operation directly. Thus no third write to a start bit or other start function is required. Note that this technique requires that the write to the base address control register always occur before the write to the word count control register. This is a minor constraint on the programmer.

Figure 8:
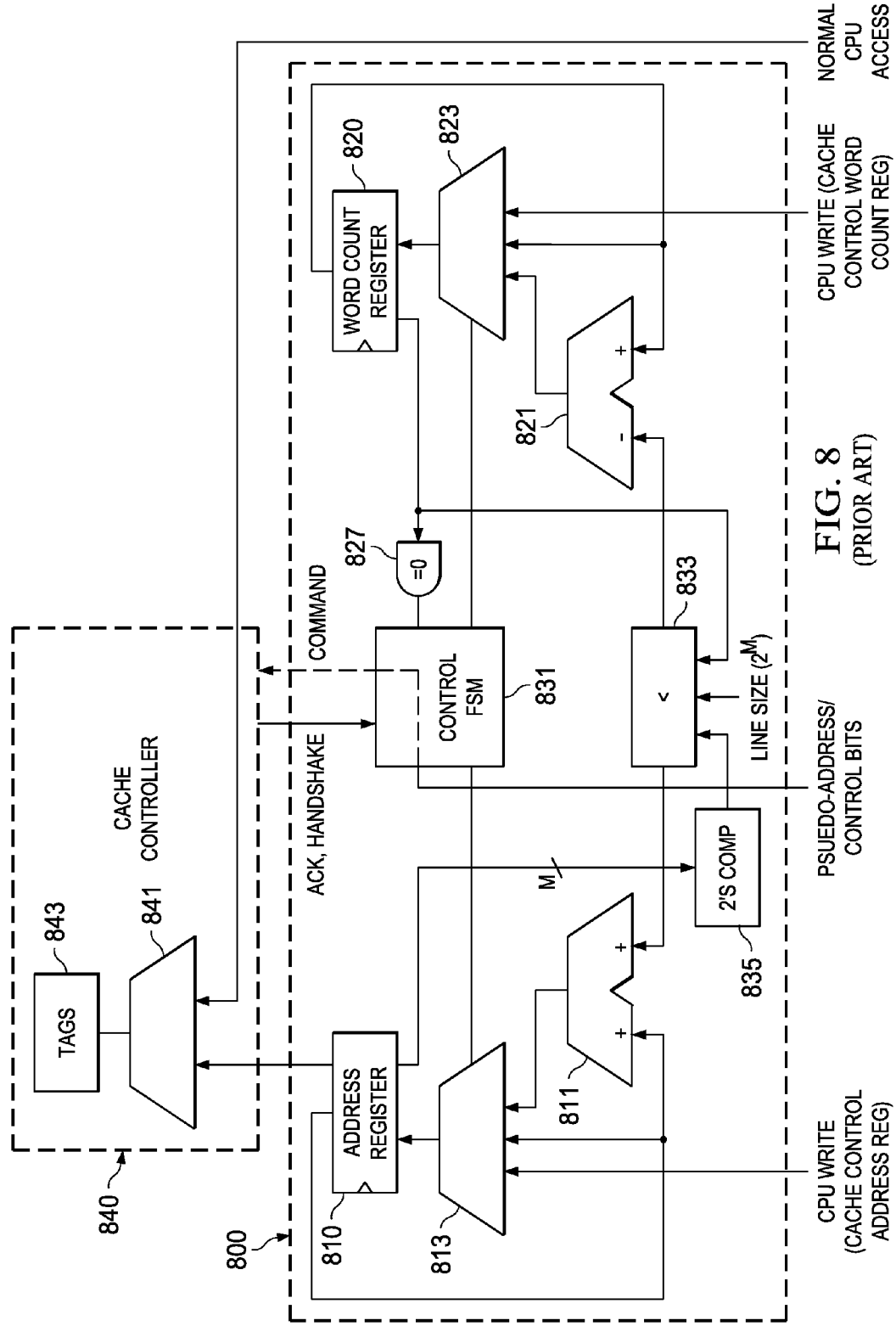
FIG. 8 illustrates the combined programmer initiated cache hardware of the preferred embodiment of this invention (prior art)

FIG. 8 illustrates the preferred embodiment of the state machine 800 employed in this invention for programmer directed cache operations. In the preferred embodiment a single physical base address register 810 is accessible at the logical addresses of writeback base address control register 801, writeback/invalidate base address control register 803, and invalidate base address control register 805. In a similar fashion a single physical word count register 820 is accessible at the logical addresses of writeback word count control register 802, writeback/invalidate word count control register 804 and invalidate word count control register 806. State machine 800 uses word count register 820 to gate its activity. State machine 800 supplies the output of address register 810 to cache controller 840 and specifically to cache tags 843 to perform pseudo-accesses. These pseudo-accesses are access of cache tags 843 only without a direct load or store operation.

Multiplexer 841 selects between normal access to cache tags 843 and programmer initiated cache operations. In the preferred embodiment, programmer initiated cache operations are triggered by a write to one of writeback word count control register 702, the writeback/invalidate word count control register 704 and invalidate word count control register 706. Controller 831 senses the write to one of the word count registers and triggers the corresponding programmer initiated cache operation via commands to cache controller 840. The address stored in physical base address register 810 is supplied to cache tags 843 via multiplexer 841. Controller 831 indicates the type of operation to cache controller 840. Physical base address register 810 is then incremented by adder 811. Note that multiplexer 813 selects either a write from central processing unit 110, the address in physical base address register 810 recirculated or the sum produced by adder 811. Adder 811 receives the address stored in physical base address register 810 at one input and the output of selector 833 at a second input. Selector 833 selects the least of three inputs. The first input is the output of 2's complement unit 835. The M least significant bits of physical base address register 810 form the input to 2's complement unit 835, where the cache entry size is $2^M$. The second input to selector 833 is the cache entry size $2^M$. The third input to selector 833 is the word count from physical word count register 820. Physical word count register 820 is similarly decremented by subtractor 821. Subtractor 821 receives the word count of physical word count register 820 at its normal or addition input. Subtractor 821 receives the output of selector 833 at its difference or subtraction input. Note that multiplexer 823 selects either a write from central processing unit 110, the word count in physical word count register 830 recirculated or the difference produced by subtractor 821.

Selector 833 makes the selection of an appropriate amount for every case. For the initial cycle, where the base address may not be aligned with the cache entries, the least input to selector 833 is the output of 2's complement unit 835. This number is the difference between the initial base address stored in physical base address register 810 and the next address boundary of cache entries. Adding this amount to base physical base address register 810 aligns the next cycle to the cache entry boundary. Physical word count register 820 is decremented by this amount. During middle cycles the least input to selector 833 is the number of data words in the cache entry. During these middle cycles the physical base address register 810 advances by the number of words in each cache entry and thus by whole cache entries. A final cycle may not be aligned with the cache entry boundary. For this final cycle the least input to selector 833 would be the data stored in physical word count register 820. This increases the address stored in physical address register 810 to the end of the determined range and decrements the word count stored in physical word count register 820 to zero. Following this final cycle, zero detector 837 signals that physical word count register 820 has decremented to zero. Controller 831 then ends the cache operation.

The address supplied by physical base address register 810 operates with the normal cache functions. If the word count was written to the address of writeback word count control register 702, then controller 831 signals cache controller 840 to writeback the cache entry accessed. Note that the address supplied by physical base address register 810 is compared with tags 841 and cache controller 840 acts only on a hit. This process continues until controller 831 stops the operation. If the word count was written to the address of writeback/invalidate word count control register 804, then controller 831 signals cache controller 840 to writeback the cache entry accessed and invalidate the cache entry. Again, cache controller 840 operates only on a hit to tags 841.

Other programmer initiated cache operations are feasible. For example, address range cache lock and cache unlock operations could use this mechanism. As already described and illustrated, state machine 800 would supply the appropriate address and commands to cache controller 840. Cache controller 840 would operate similarly to the known art to lock or unlock the cache entries including the addresses within the specified address range.

In accordance with this invention state machine 800 make the completion of the programmer initiated cache operation visible to central processing unit 110. This could be by generation of an interrupt upon completion. Alternatively, state machine 800 could generate another type control signal. As a further alternative, physical word count register 820 is made readable by central processing unit 110. This permits central processing unit 110 to poll this register. If the word count is zero, then state machine 800 has completed the programmer initiated cache operation. As a further alternative completion of the programmer initiated cache operation could set or clear a bit or bits in another predetermined control register which is polled by central processing unit 110.

The above description of state machine 800 is an example of tight control. A tightly controlled cache control system requires full adders 811 and 821 to handle all possible alignments and word counts. Such a tight control handles cases in which the start and end of the specified address range is not aligned to a cache entry boundary. The base address increment and word count decrement are selected as the lesser of: the word count register; the 2's complement of the M least significant bits of the address; and the cache line size in words. This provides correct operation in the boundary cases.

Figure 9:
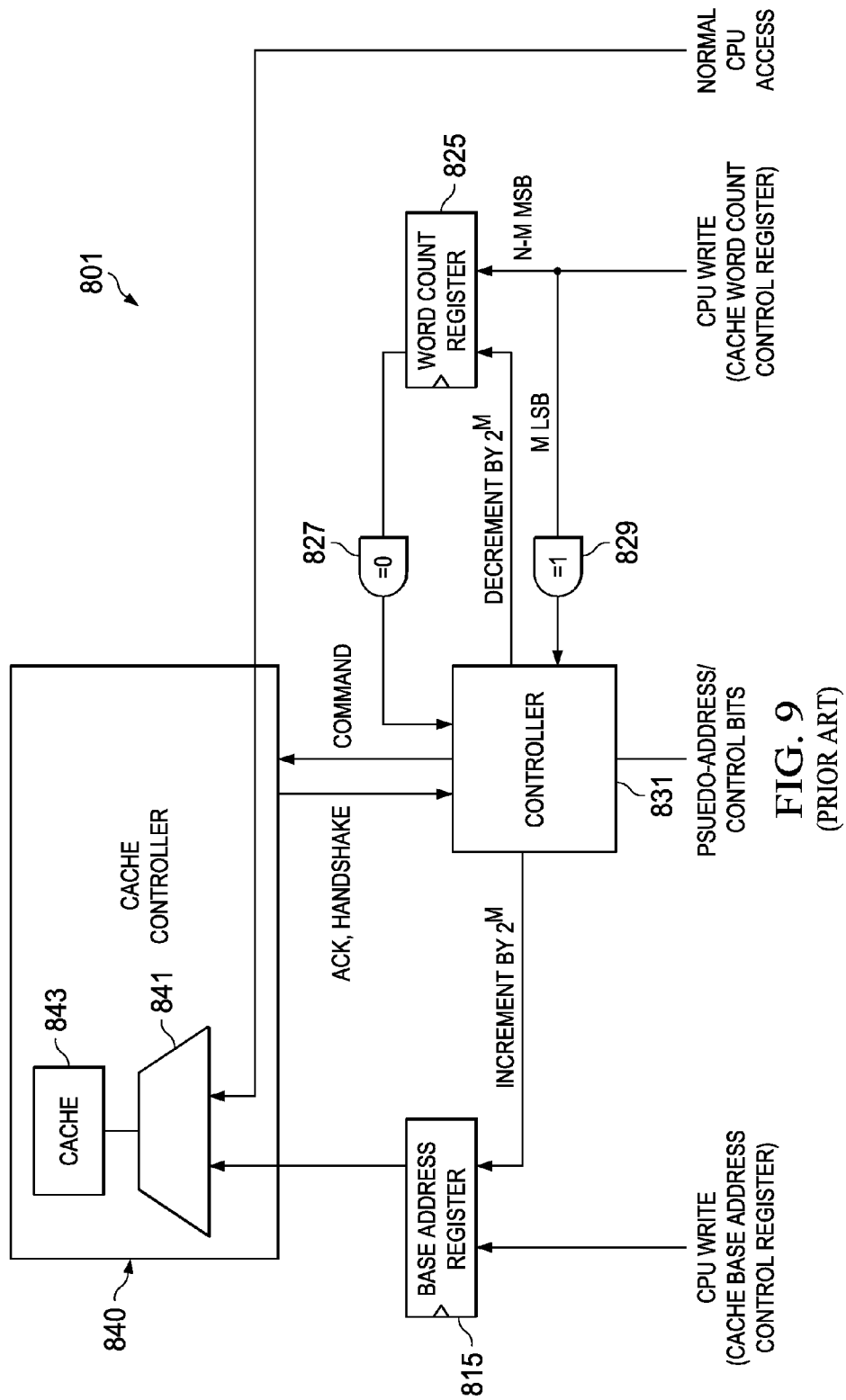
FIG. 9 illustrates alternative programmer initiated cache hardware of this invention (prior art)

FIG. 9 illustrates state machine 801, which is an example of this invention implementing loose control. Loose control permits the use of simplified hardware as compared to that illustrated in FIG. 8. In loose control all operations take place on whole cache entries regardless of the address range alignment. Physical base address register 815 and physical word count register 825 are implemented as incrementable count registers. Physical base address register 815 receives write data for writes to the logical addresses of writeback base address control register 701, writeback/invalidate base address control register 703 and invalidate base address control register 705. Physical word count register 825 receives the write data for writes to the logical addresses of writeback word count control register 702, writeback/invalidate word count control register 704 and invalidate word count control register 706. Physical base address register 815 and physical word count register 825 may omit storage of the M least significant bits, where $2^M$ is the size of the cache entries. This omission is possible because only whole cache entries will be accessed. Ones detector 829 receives the M least significant bits written to physical word count register 825 and supplies a signal to controller 831 if any of these bits is a 1. For each update controller 831 controls physical base address register 815 to increment by $2^M$ and controls physical word count register 825 to decrement by $2^M$. By omission of the unneeded M least significant bits, these operations require change of a single bit and a carry ripple. Cache operations continue until zeros detector 827 detects that the N−M most significant bits of physical word count register 825 are all 0, where N is the size of physical word count register 825. Controller 831 makes and exception if ones detector 829 detected that at least one of the M least significant bits was a 1. In this case, the actual word count would have pointed to the next cache entry. Accordingly, controller 831 controls a final cache operation in this case.

The tightly controlled system illustrated in FIG. 8 is clearly the most robust, accounting for all special cases. In reality many cache systems may not require this level of exactness. In the loosely controlled system illustrated in FIG. 9, state machine 801 operates generally the same, as is the routing of the address register to the cache controller and the operation of the word count register. However, the adder and subtractor functions are simplified to increment and decrement by performing operations on complete cache lines. The data size may be reduced by M bits, where $2^M$ is the cache line size. The comparator and 2's complement functions are eliminated. In the loosely controlled system illustrated in FIG. 9, any cache entry which is within the address range of the base address and word count will be operated on. The effect of this is that more data is operated on than requested if the address and/or word count are not evenly divisible by $2^M$. Since this occurs in a cache which transparently services requests for data, this is often acceptable.

Figure 10:
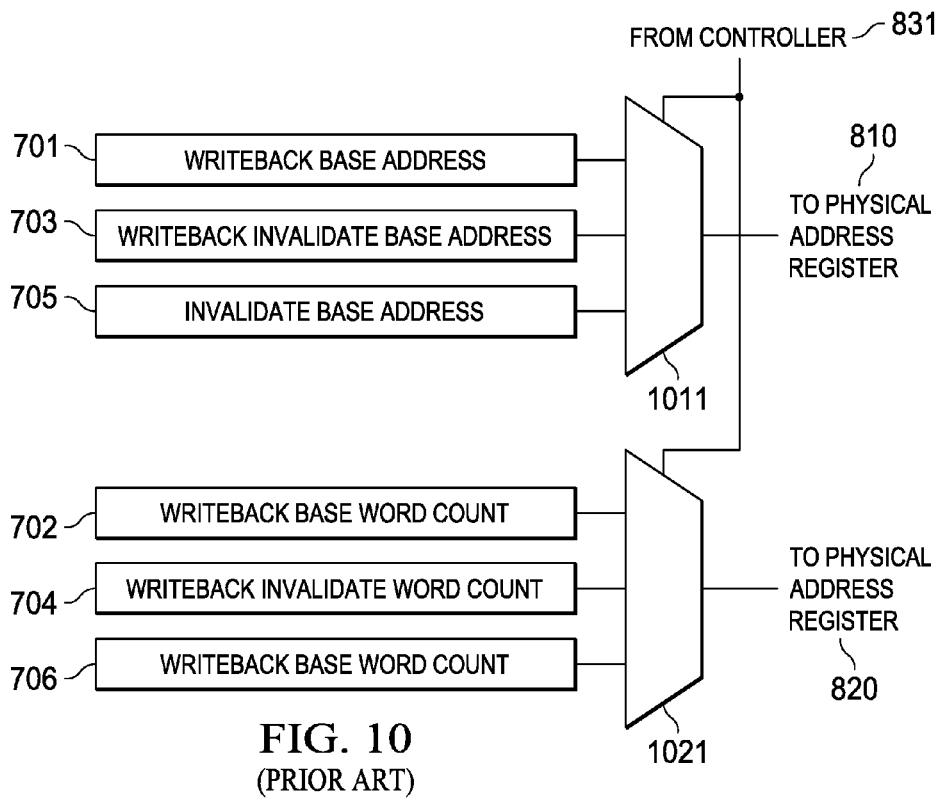
FIG. 10 illustrates an alternative permitting loading of the base address register and the word count register from separate physical registers (prior art)

FIG. 10 illustrates another modification of the preferred embodiment of FIG. 8. FIG. 10 illustrates separate physical registers 701 to 706 corresponding to the previously defined logical registers. Upon detection of a programmer initiated cache operation, controller 831 copies data from the corresponding physical registers 701 to 706 into the physical base address register 810 and physical word count register 820. As shown in FIG. 10, multiplexer 1011 is controlled by controller 831 to select one of writeback base address control register 701, writeback/invalidate base address control register 703 or invalidate base address control register 705. Similarly, multiplexer 1021 is controlled by controller 831 to select one of writeback word count control register 702, writeback/invalidate word count control register 704 or invalidate word count control register 706. Thus the hardware of state machine 800 may be reused while maintaining physical registers for each type cache operation supported.

As a further alternative, it is possible to provide a state machine like state machine 800 for each type cache operation supported. In this event simultaneous programmer initiated cache operations may occur with the addition of hardware to support such operations.

For most applications it is acceptable to simply reuse control registers such as physical base address register 810 and physical word count register 820 as part of a single state machine 800. As the cache operations are performed, physical base address register 810 and physical word count register 820 are dynamically updated by state machine 800. Thus these registers track the cache operation as it proceeds. One advantage of this scheme is the programmer can monitor the operations directly by monitoring the state of physical base address register 810 and physical word count register 820 to determine when accesses have completed.

The nature of cache operations that this mechanism initiates permits many optimizations. For example, if writebacks are being performed, it is not necessary to provide support for simultaneous execution of additional cache block operations. The writeback operation will inherently bottleneck at the cache to memory interface. Thus other programmer initiated cache operations would not execute faster even if separate hardware support were provided. Such optimizations can result in fewer boundary conditions. For example, the hardware can be simplified by stalling subsequent writes from central processing unit 110 to base address control registers 701, 703 and 705 and to word count control registers 702, 704 and 706 until a current cache operation is complete. This not only prevents the central processing unit 110 from possibly corrupting the operation in progress, but also prevents the cache design from having to deal with sporadic operations. Serializing cache operations this way allows the address and word counting hardware to be reused for multiple types of cache operations.

Figure 11:
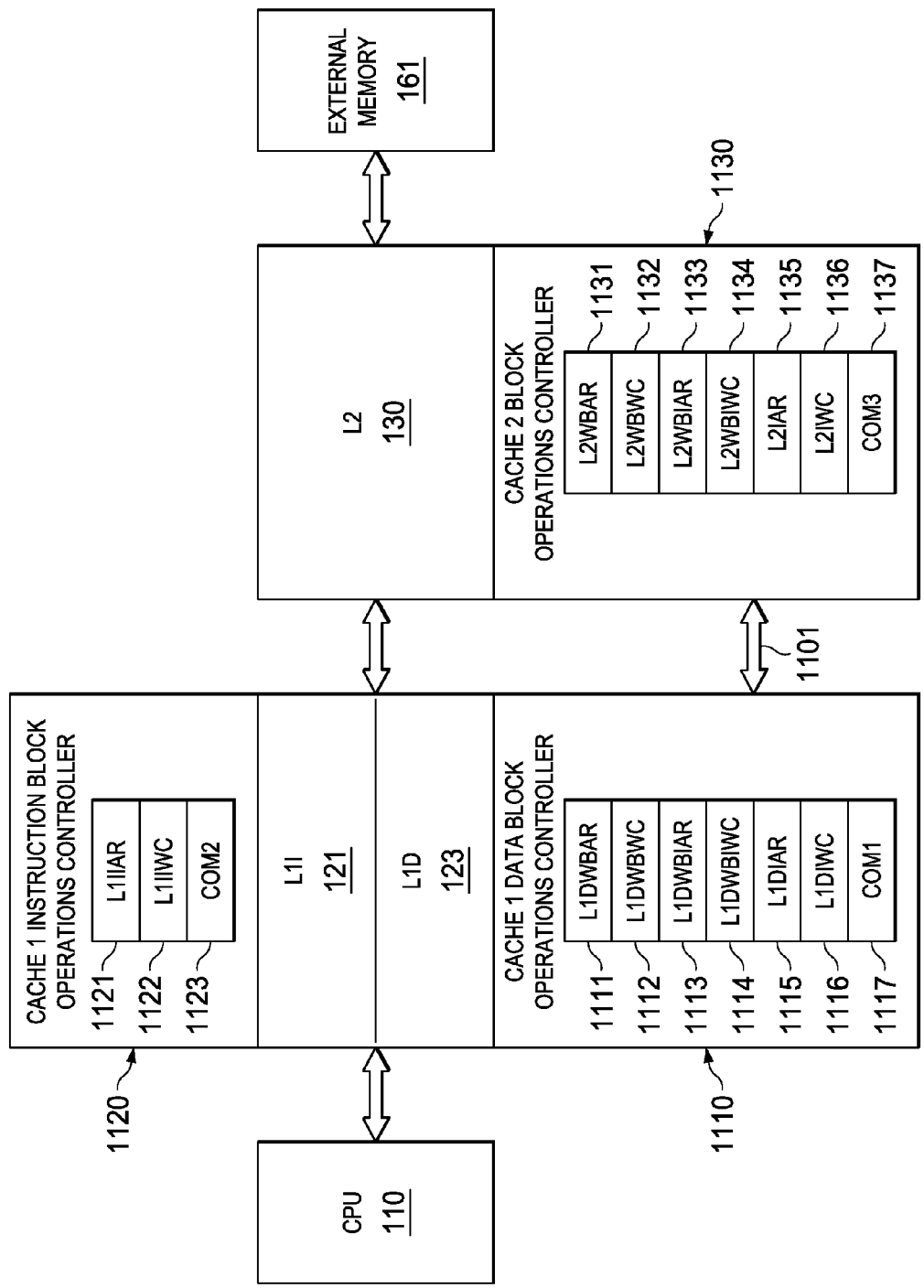
FIG. 11 illustrates separate cache operation controllers for separate levels of cache of this invention.

FIG. 11 illustrates a preferred embodiment of this invention. FIG. 11 illustrates central processing unit (CPU) 110, level one instruction cache (L1I) 121, level one data cache (L1D) 123, level two combined cache (L2) 130 and external memory 161. Level one instruction cache (L1I) 121, level one data cache (L1D) 123 and level two combined cache (L2) 130 each have its own cache operation control.

L1D cache 123 has corresponding cache 1 data block operations control 1110 responsive to control registers 1111 to 1117. These control registers include level one data writeback base address control register (L1DWBAR) 1111, level one data writeback word count control register (L1DWBWC) 1112, level one data writeback base address control register (L1DWBAR) 1113, level one data writeback/invalidate word count control register (L1DWBIWC) 1114, level one data invalidate base address control register (L1DIAR) 1115, level one data invalidate word count control register (L1DIWC) 1116 and level one data completion register (COM1) 1117.

L1I cache 121 has corresponding cache 1 instruction block operations control 1120 responsive to control registers 1121 to 1123. These control registers include level one instruction invalidate base address control register (L1IIAR) 1121, level one instruction invalidate word count control register (L1IIWC) 1122 and level one instruction completion register (COM2) 1123. The preferred embodiment of this invention does not support writes into L1I cache 121. Changing instructions of an operating program is called self-modifying code and is generally considered poor programming form. Thus there is never any dirty entry in L1I cache 121. Thus writeback is never required. Accordingly, there are no control registers for writeback/invalidate operation or for writeback operation. The two separate level one cache operation controllers 1110 and 1120 enable the programmer to control each level one cache individually for synchronizing to the next level of cache or external memory.

L2 cache 123 has corresponding cache block operations control 1130 responsive to control registers 1131 to 1137. These control registers include level two writeback base address control register (L2WBAR) 1131, level two writeback word count control register (L2WBWC) 1132, level two writeback base address control register (L2WBAR) 1133, level two writeback/invalidate word count control register (L2WBIWC) 1134, level two invalidate base address control register (L2IAR) 1135, level two invalidate word count control register (L2IWC) 1136 and level two completion register (COM3) 1137.

Each cache operation controller 1110, 1120 and 1130 includes a control state machine such as illustrated in FIGS. 8 and 9 to process these cache operations. These control state machines are independent but may be synchronized for an all-level cache operation.

Figure 12:
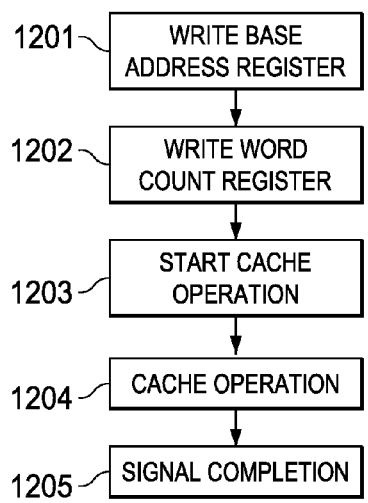
FIG. 12 illustrates operations flow in a cache block operation on a single cache layer.

FIG. 12 illustrates the flow of operations on a single level of cache. In block 1201 CPU 110 writes to the corresponding base address register. In the preferred embodiment this is a write to a memory mapped control register. In block 1202 CPU 110 writes to the corresponding word count register. In the preferred embodiment this control register write to the memory mapped word count register initiates the corresponding cache operation (block 1203). As noted above it is feasible to require CPU 110 to execute a corresponding instruction or perform some other operation to initiate the cache block operation.

In block 1204 the corresponding cache operation controller performs the programmer initiated cache block operation as previously described in conjunction with FIGS. 8 and 9. This operation completes when the controller has traversed the entire address range set by the corresponding base address register and the corresponding word count register. Block 1205 signals completion following the end of all memory transactions. For cache transactions terminating in an internal memory or cache, completion is signaled when the transaction has been committed to that memory. For transactions terminating in an external memory, the completion notification waits for acknowledgment from the external memory. This acknowledgment is achieved by a non-corrupting transaction that is sent out by the controller interfacing to the external memory. The controller then waits until that transaction finishes. This transaction is guaranteed to flush any previous cache traffic generated by the coherence operation. The controller ensures that this transaction goes to the same endpoint as the previous transactions and is of a type that cannot be arbitrated ahead of any previous transfers by the external memory. Thus return of the non-corrupting transaction results assures completion of prior transactions. In the preferred embodiment completion is signaled by a predetermined write to the corresponding completion control register such as COM1, COM2 and COM3 illustrated in FIG. 11. As noted above completion could also be signaled by an interrupt, another type control signal or by a zero in the physical word count register 820.

Figure 13:
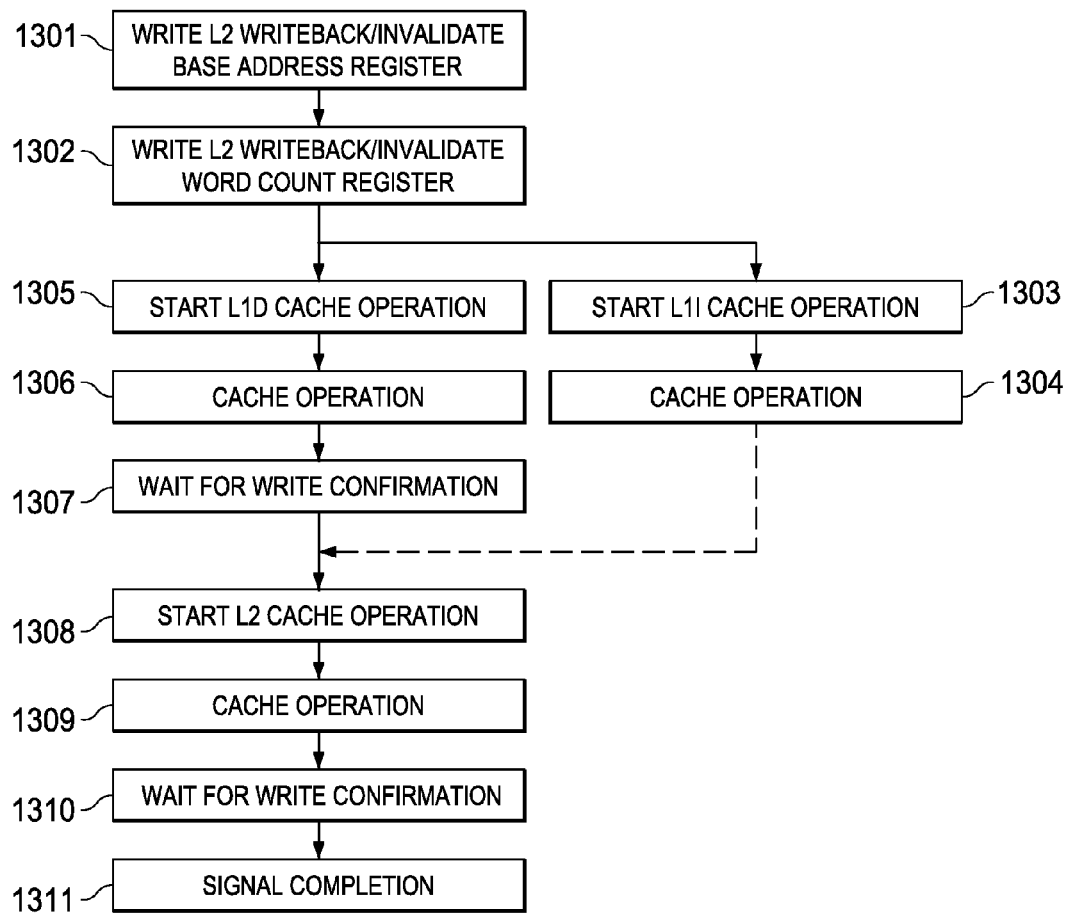
FIG. 13 illustrates operations flow in a writeback/invalidate operation on the level one and level two caches of the preferred embodiment of this invention.

FIG. 13 illustrates operations flow in a writeback/invalidate operation on both the level one and the level two caches of the preferred embodiment of this invention. In block 1301 CPU 110 writes to the level two writeback/invalidate base address control register (L2WBIAR) 1133. In block 1302 CPU 110 writes to the level two writeback/invalidate word count control register (L2WBIWC) 1134. In the preferred embodiment this control register write to the word count register initiates the corresponding cache operation. As noted above it is feasible to require CPU 110 to execute a corresponding instruction or perform some other operation to initiate the cache operation. In the preferred embodiment of this invention writes to level two writeback/invalidate word count control register (L2WBIWC) 1134 triggers the corresponding cache block operation on both level one caches L1I cache 121 and L1D cache 123 and on L2 cache 130. This is merely a design choice and a system could support separate operations on just L2 cache 130. This option would require separate mechanisms to trigger the level two only operation and the combined level one and level two operation.

Block 1303 begins the writeback/invalidate operation in L1I cache 121. According to this preferred embodiment of the invention separate cache block operations occur in L1I cache 121 and L1D cache 123. Block 1304 performs this writeback/invalidate in L1I cache 121. As noted above the preferred embodiment of this invention does not support writes into L1I cache 121. Performing this writeback/invalidate operation in L1I cache 121 thus only invalidates cache entries within the address range. In the preferred embodiment the base address stored in register L2WBIAR 1133 is transferred to register L1IIAR 1121 and the word count stored in register L2WBIWC 1134 is transferred to register L1IIWC 1122. It is equally feasible to select this data using multiplexers similar to those illustrated in FIG. 10. In block 1304 cache 1 instruction operation controller 1120 performs the cache operation as previously described in conjunction with FIGS. 8 and 9.

This operation completes when the operation controller 1120 has traversed the entire address range. This cache operation does not result in any write to another cache or memory and thus does not need to wait for acknowledgment of any write to complete. Thus the dotted line return to block 1308. In the preferred embodiment the partial completion is not signaled. However it is feasible to signal partial by a predetermined write to the completion control register COM2. As noted above completion could also be signaled by an interrupt, another type control signal or by a zero in the physical word count register 820.

In block 1305 this writeback/invalidate operation starts in L1D cache 123. In the preferred embodiment the base address stored in register L2WBIAR 1133 is transferred to the base address control register L1DWBIAR 1113 and the word count stored in register L2WBIWC 1134 is transferred to register L1DWBIWC 1123. It is equally feasible to select this data using multiplexers similar to that illustrated in FIG. 10. In block 1306 cache 1 data operation controller 1120 performs the cache operation. This operation completes when the controller has traversed the entire address range. In block 1307 L1D cache 123 waits for any write confirmation from other memory as described above in conjunction with FIG. 12. In the preferred embodiment the partial completion is not signaled. However it is feasible to signal partial completion by a predetermined write to the completion control register COM1. As noted above completion could also be signaled by an interrupt, another type control signal or by a zero in the physical word count register 820.

The operations in L1I cache 121 at blocks 1303 and 1304 and the operations in L1D cache 123 at blocks 1305, 1306 and 1307 preferably occur simultaneously. This requires both cache 1 data block operations controller 1110 and cache 1 instruction block operation controller 1120 to each have cache operations controllers such as illustrated in FIGS. 8 and 9. Because L1I cache 121 includes no dirty data and thus does not generate any writebacks these cache block operations do not interfere. Thus these operations can occur separately in separate hardware.

In block 1308 this writeback/invalidate operation starts in L2 cache 130. In block 1309 cache 1 operation controller 1130 performs the cache operation. This operation completes when the controller has traversed the entire address range. In block 1314 cache 2 operations controller 11130 waits for any write confirmation from other memory as described above in conjunction with FIG. 12. Block 1311 signals the operation complete. This could be signaled by a predetermined write into to the completion control register COM3. As noted above completion could also be signaled by an interrupt, another type control signal or by a zero in the physical word count register 820.

Figure 14:
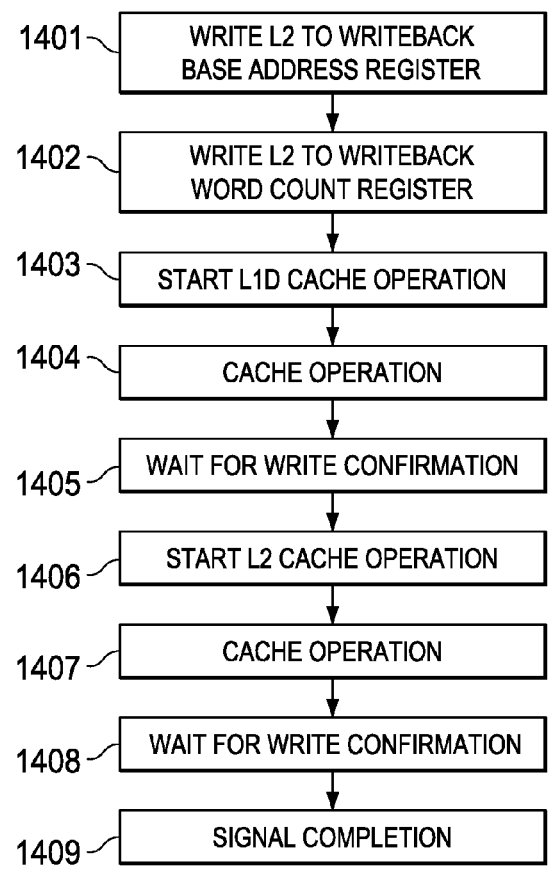
FIG. 14 illustrates operations flow in a writeback operation on the level one and level two caches of the preferred embodiment of this invention.

FIG. 14 illustrates operations flow in a writeback operation on the level one and level two caches of the preferred embodiment of this invention. In block 1401 CPU 110 writes to the level two writeback base address control register (L2WBAR) 1131. In block 1402 CPU 110 writes to the level two writeback word count control register (L2WBWC) 1132. In the preferred embodiment this control register write to the word count register initiates the corresponding cache operation. As noted above it is feasible to require CPU 110 to execute a corresponding instruction or perform some other operation to initiate the cache operation. In the preferred embodiment of this invention writes to level two writeback word count control register (L2WBWC) 1132 triggers the corresponding cache block operation on both level one caches L1I cache 121 and L1D cache 123 and on L2 cache 130. This is merely a design choice and a system could support separate operations on just L2 cache 130. This option would require separate mechanisms to trigger the level two only operation and the combined level one and level two operation.

Block 1403 begins the writeback operation in L1I cache 123. According to this preferred embodiment of the invention no writes are supported into L1I cache 121, thus this cache never requires writeback. Block 1404 performs this writeback in L1D cache 123. In the preferred embodiment the base address stored in register L2WBAR 1131 is transferred to register L1DWBAR 1111 and the word count stored in register L2WBWC 1132 is transferred to register L1DWBWC 1112. It is equally feasible to select this data using multiplexers similar to those illustrated in FIG. 10. In block 1404 cache 1 data operations controller 1110 performs the cache operation as previously described in conjunction with FIGS. 8 and 9. This operation completes when operation controller 1110 has traversed the entire address range. In block 1405 L1D cache 123 waits for any write confirmation from other memory as described above in conjunction with FIG. 12. In the preferred embodiment the partial completion is not signaled. However it is feasible to signal partial by a predetermined write to the completion control register COM2. As noted above completion could also be signaled by an interrupt, another type control signal or by a zero in the physical word count register 820.

In block 1406 this writeback operation starts in L2 cache 130. In block 1407 cache 2 operation controller 1130 performs the cache operation. This operation completes when the controller has traversed the entire address range. In block 1408 L2 cache 130 waits for any write confirmation from other memory as described above in conjunction with FIG. 12. Block 1409 signals the operation complete. This could be signaled by a predetermined write into to the completion control register COM3. As noted above completion could also be signaled by an interrupt, another type control signal or by a zero in the physical word count register 820.

Figure 15:
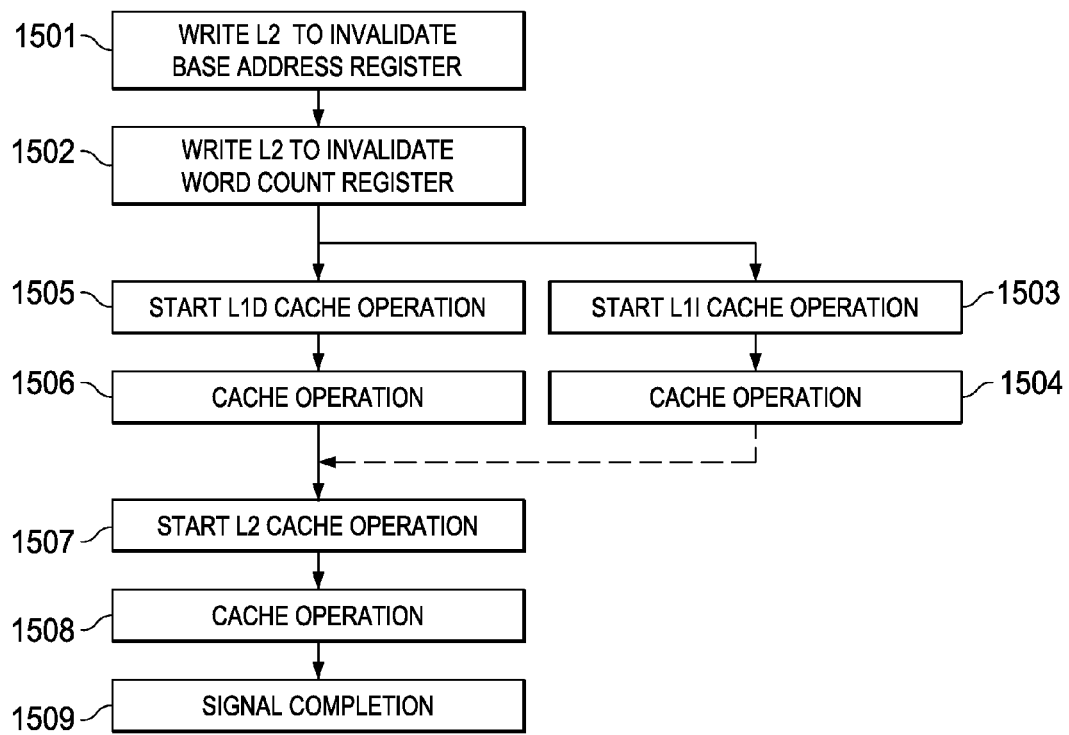
FIG. 15 illustrates operations flow in an invalidate operation on the level one and level two caches of the preferred embodiment of this invention.

FIG. 15 illustrates operations flow in an invalidate operation on the level one and level two caches of the preferred embodiment of this invention. In block 1501 CPU 110 writes to the level two invalidate base address control register (L2IAR) 1135. In block 1502 CPU 110 writes to the level two invalidate word count control register (L2IWC) 1136. In the preferred embodiment this control register write to word count register (L2IWC) 1136 initiates the corresponding cache operation. As noted above it is feasible to require CPU 110 to execute a corresponding instruction or perform some other operation to initiate the cache operation. In the preferred embodiment of this invention writes to the level two invalidate word count control register (L2IWC) 1136 triggers the corresponding cache block operation on both level one caches L1I cache 121 and L1D cache 123 and on L2 cache 130. This is merely a design choice and a system could support separate operations on just L2 cache 130. This option would require separate mechanisms to trigger the level two only operation and the combined level one and level two operation.

Block 1503 begins the invalidate operation in L1I cache 121. According to this preferred embodiment of the invention separate cache block operations occur in L1I cache 121 and L1D cache 123. Block 1504 performs this invalidate in L1I cache 121. In the preferred embodiment the base address stored in register L2IAR 1135 is transferred to register L1IAR 1121 and the word count stored in register L2IWC 1136 is transferred to register L1IIWC 1122. It is equally feasible to select this data using multiplexers similar to those illustrated in FIG. 10. In block 1504 cache 1 instruction operation controller 1120 performs the cache operation as previously described in conjunction with FIGS. 8 and 9. This operation completes when the operation controller 1120 has traversed the entire address range. This cache operation does not result in any write to another cache or memory and thus does not need to wait for acknowledgment of any write to complete. Thus the dotted line return to block 1507. In the preferred embodiment the partial completion is not signaled. However it is feasible to signal partial by a predetermined write to the completion control register COM2. As noted above completion could also be signaled by an interrupt, another type control signal or by a zero in the physical word count register 820.

In block 1505 this invalidate operation starts in L1D cache 123. In the preferred embodiment the base address stored in register L2IAR 1135 is transferred to the base address control register L1DIAR 1115 and the word count stored in register L2IWC 1136 is transferred to register L1DIWC 1116. It is equally feasible to select this data using multiplexers similar to that illustrated in FIG. 10. In block 1506 cache 1 data operation controller 1120 performs the cache operation. This operation completes when the controller has traversed the entire address range. This cache operation does not result in any write to another cache or memory and thus does not need to wait for acknowledgment of any write to complete. In the preferred embodiment the partial completion is not signaled. However it is feasible to signal partial completion by a predetermined write to the completion control register COM1. As noted above completion could also be signaled by an interrupt, another type control signal or by a zero in the physical word count register 820.

The operations in L1I cache 121 at blocks 1503 and 1504 and the operations in L1D cache 123 at blocks 1505 and 1506 preferably occur simultaneously. This requires both cache 1 data block operations controller 1110 and cache 1 instruction block operation controller 1120 to each have cache operations controllers such as illustrated in FIGS. 8 and 9. Because this invalidate operation generates no writebacks these cache block operations do not interfere. Thus these operations can occur separately in separate hardware.

In block 1507 this invalidate operation starts in L2 cache 130. In block 1508 cache 1 operation controller 1130 performs the cache operation. This operation completes when the controller has traversed the entire address range. This cache operation does not result in any write to another cache or memory and thus does not need to wait for acknowledgment of any write to complete. Block 1509 signals the operation complete. This could be signaled by a predetermined write into to the completion control register COM3. As noted above completion could also be signaled by an interrupt, another type control signal or by a zero in the physical word count register 820.

This invention could also be practiced in systems including a third level cache between L2 cache 130 and external memory 161. A user initiated cache block operations could cover all three cache levels, only L2 cache 130 and this third level cache or just this third level cache according to the principles described above.

A prior art solution to this coordinated cache level cache block operations requires the user to completely control the operation by separately controlling operation all cache transactions. This risks a user or program error causing data corruption and system instability. Another prior art solution forces L2 cache 131 to snoop data out of L1I cache 121 and L1D cache 123. This is inefficient as compared to the invention.

Prior art cache block operations frequently do not track if the cache transaction actually terminated at the endpoint. That introduces the risk of race conditions particularly in a multi-core system. Each core does not have a way of knowing when the operation is complete. A prior art solution to this problem builds intelligence to confirm cache transactions terminate into each endpoint. This increases complexity and is often not possible since these endpoints are pre-designed modules that cannot be changed during system design. Another prior art solution requires the user to use locking mechanism to correctly sequence access from different cores to the endpoint. This prior art solution moves the burden from hardware to the user requiring the user to follow the recommended protocol.

In this invention the user has the flexibility of controlling each cache independently for cache coherency. This invention protects against user error in sequencing because hardware is responsible for correct sequencing. Each cache controller is responsible for making sure that the controller above it has completed its operation. The cache controller then start its own coherence guaranteeing correct ordering. Each controller also waits for a completion acknowledgment from the lower level cache, before moving itself to completion status. Each cache controller guarantees that completion also means that any cache transaction that ends in it is complete and that any cache transactions of a previous cache level are also complete.

What is claimed is:

1. A data processing system comprising:
a central processing unit executing program instructions to manipulate data;
at least one first level cache connected to said central processing unit temporarily storing in a plurality of cache lines at least one of program instructions for execution by said central processing unit and data for manipulation by said central processing unit, each cache line including a tag indicating a memory address of said program instruction or said data stored therein; and
at least one first cache operation unit connected to said at least on first level cache capable of performing a program controlled cache state operation selected from a predetermined set of program controlled cache state operations on a corresponding program designated address range encompassing a plurality of cache lines;
a second level cache connected to said first level cache temporarily storing in a plurality of cache lines at least one of program instructions for execution by said central processing unit and data for manipulation by said central processing unit, each cache line including a tag indicating a memory address of said program instruction or said data stored therein; and
a second level cache operation unit connected to said first level cache operation unit and said second level cache capable of performing a combined program controlled cache state operation selected from the predetermined set of program controlled cache state operations on a corresponding program designated address range encompassing a plurality of cache lines in each of said at least one first level cache and said second level cache on a program designated address range encompassing a plurality of cache lines having the same address range for said at least one first level cache and said second level cache.

2. The data processing system of claim 1, wherein:
said program controlled cache state operation consists of cache writeback of data cached from said program designated address range to a higher level memory.

3. The data processing system of claim 1, wherein:
said program controlled cache state operation consists of cache writeback of data cached from said program designated address range to a higher level memory and invalidation of data cached from said program designated address range.

4. The data processing system of claim 1, wherein:
said program controlled cache state operation consists of invalidation of data cached from said program designated address range.

5. The data processing system of claim 1, wherein:
said first level cache operation unit includes
   a first base address register loadable by said central processing unit,
   a first word count register loadable by said central processing unit;
said second level cache operation unit includes
   a second base address register loadable by said central processing unit,
   a second word count register loadable by said central processing unit;
wherein said program designated address range of said program controlled cache state operations in said at least one first level cache are from a base address corresponding to data stored in said first base address register for a number of words of corresponding to data stored in said first word count register; and
wherein said program designated address range of said combined program controlled cache state operations in each of said at least one first level cache and said second level cache are from a base address corresponding to data stored in said second base address register for a number of words of corresponding to data stored in said second word count register.

6. The data processing system of claim 5, wherein:
each said program controlled cache state operation triggers upon loading a corresponding word count register.

7. The data processing system of claim 1, wherein:
said second cache operation unit signals completion of said combined cache block operation in each of said at least one first level cache and said second level cache.

8. The data processing system of claim 7, wherein:
said second cache operation unit signals completion of said combined cache block operation by generating an interrupt to said central processing unit.

9. The data processing system of claim 7, wherein:
said second cache operation unit signals completion of said combined cache block operation by writing predetermined data to a predetermined control register.

10. The data processing system of claim 7, wherein:
said second cache operation unit determines completion of said combined cache block operation in each of said at least one first level cache and said second level cache for transactions terminating in an internal memory or cache by determining when any transaction has been committed to that internal memory or cache.

11. The data processing system of claim 7, wherein:
said second cache operation unit determines completion of said combined cache block operation in each of said at least one first level cache and said second level cache for transactions terminating in an external memory by waiting for acknowledgment from the external memory.

12. The data processing system of claim 11, wherein:
said second cache operation unit determines obtains acknowledgment from the external memory by
   sending a non-corrupting transaction guaranteed to flush any previous cache traffic generated by the coherence operation of a type that cannot be arbitrated ahead of any previous transfers to the same endpoint as the previous transactions, and
   waiting for return of the non-corrupting transaction results from the external memory.

13. The data processing system of claim 1, wherein:
said at least one first level cache includes a first level instruction cache storing instructions and a first level data cache storing data; and
at least one first cache operation unit includes a first level instruction cache controller connected to said first level instruction cache and a first level data controller cache connected to said first level data cache.

* * * * *